US006858374B2

(12) United States Patent
Yanaka

(10) Patent No.: US 6,858,374 B2
(45) Date of Patent: Feb. 22, 2005

(54) LITHOGRAPHIC PRINTING PLATE PRECURSOR

(75) Inventor: Hiromitsu Yanaka, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 106 days.

(21) Appl. No.: 10/236,913

(22) Filed: Sep. 9, 2002

(65) Prior Publication Data

US 2003/0068575 A1 Apr. 10, 2003

(30) Foreign Application Priority Data

Sep. 10, 2001 (JP) .................................... P.2001-273784

(51) Int. Cl.$^7$ ............................ G03F 7/032; G03F 7/30

(52) U.S. Cl. ................................ 430/281.1; 430/288.1; 430/271.1; 430/302

(58) Field of Search ........................... 430/281.1, 288.1, 430/271.1, 302

(56) References Cited

U.S. PATENT DOCUMENTS

| | | | | | |
|---|---|---|---|---|---|
| 6,025,112 | A | * | 2/2000 | Tsuda | 430/281.1 |
| 6,660,446 | B2 | * | 12/2003 | Shimada et al. | 430/270.1 |
| 2003/0003399 | A1 | * | 1/2003 | Muller et al. | 430/287.1 |

* cited by examiner

*Primary Examiner*—John S. Chu
(74) *Attorney, Agent, or Firm*—Sughrue Mion, PLLC

(57) ABSTRACT

A lithographic printing plate precursor is disclosed, comprising a support having provided thereon a photosensitive layer containing at least (A) an infrared ray absorbing agent, (B) an onium salt, (C) a radically polymerizable compound, (D) a binder polymer and (E) an organic dye or the precursor thereof capable of undergoing change in color tone upon exposure.

6 Claims, No Drawings

LITHOGRAPHIC PRINTING PLATE PRECURSOR

FIELD OF THE INVENTION

The present invention relates to a lithographic printing plate precursor responsive to light of an infrared wavelength region and, more particularly, to a negative-working lithographic printing plate precursor which permits so-called direct plate-making using infrared laser irradiated according to digital signals from a computer or the like.

BACKGROUND OF THE INVENTION

In recent years, laser technology has been markedly developed. In particular, small-sized solid state lasers or semiconductor lasers (hereinafter sometimes referred to as "infrared lasers") emitting infrared rays of 760 nm to 1200 nm with a high output have become easily available. These lasers are extremely useful as a recording light source in directly making a plate based on digital data from a computer or the like. Thus, there has recently been an increasing demand for an image-recording material having a high responsiveness to such an infrared ray source, i.e., an image-recording material which undergoes a large change in solubility for a developing solution upon being irradiated with infrared rays.

As such negative-working image-recording material which can be recorded by means of an infrared laser, a recording material is described in U.S. Pat. No. 5,340,699 which comprises an infrared ray-absorbing agent, an acid generator, a resol resin and a novolak resin. However, in order to form an image, such negative-working image-recording materials require heating treatment after exposure with a laser. Therefore, there has been desired a negative-working image-recording material which does not require the heating treatment after exposure.

For example, Japanese Patent Publication No. 103171/1995 describes a recording material not requiring the heating treatment after exposure, which comprises a cyanine dye having a specific structure, an iodonium salt and an addition polymerizable compound having an ethylenically unsaturated double bond. However, this image-recording material involves a problem that discrimination between laser beam-exposed areas and laser beam-unexposed areas is obtained with difficulty by an eye after exposure and before development, that is, a problem of inferior print-out properties.

SUMMARY OF THE INVENTION

An object of the present invention is to provide a negative-working lithographic printing plate precursor which can be subjected to direct print-making by recording according to digital data from a computer or the like using a solid state laser or a semiconductor laser emitting infrared rays.

The inventors have found that the lithographic printing plate precursor which undergoes change in laser beam-exposed areas can be obtained by incorporating into the photosensitive layer an organic dye or the precursor thereof capable of undergoing change in color tone due to an active seed generated by heat or exposure, thus having completed the present invention based on the finding.

That is, the lithographic printing plate precursor of the present invention comprises a support having provided thereon a photosensitive layer containing at least an infrared ray-absorbing agent, an onium salt, a radically polymerizable compound, a binder polymer and an organic dye or precursor thereof capable of undergoing change in color tone upon exposure.

DETAILED DESCRIPTION OF THE INVENTION

The present invention is described in detail below.

First, a characteristic aspect of the lithographic printing plate precursor of the present invention, i.e., component (E) of an organic dye or the precursor thereof capable of undergoing change in color tone upon exposure is described below (hereinafter also referred to as simply "organic dye or the dye precursor").

The term "undergoing change in color tone" includes all of coloring (i.e., color-forming: a change from colorless state to colored state), fading (a change from colored state to colorless state) and color change (a change from one colored state to different colored state). As the organic dye or the precursor thereof, those which are decomposed by heat generated by exposure to undergo change in color tone and those which react with an active seed generated by exposure to undergo change in color tone may be used. The term "activeseed" as used herein means a radical, an acid or a base compound.

As the organic dyes which undergo fading or color change, there are illustrated triphenylmethane, diphenylmethane, oxazine, xanthene, iminonaphthoquinone, azomethine and anthraquinone dyes, represented by Victoria Pure Blue BOH, Oil Blue#603, Patent Pure Blue, Brilliant Green, Ethyl Violet, Methyl Violet, Methyl Green Erythrosine B, Basic Fuchsine, Malachite Green, Oil red, m-cresol purple, Rhodamine B, Auramine, 4-p-diethylaminophenyliminonaphthoquinone, cyano-p-diethylaminophenylacetanilide.

On the other hand, dye precursors capable of forming color include leuco dyes.

Of these organic dyes or the precursors thereof capable of undergoing change in color tone upon exposure, leuco dyes capable of forming color with an acid are preferred in view of image-forming properties as well. Specifically, there are illustrated triphenylmethanephthalides such as 3,3-bis(p-dimethylaminophenyl)phthalide, 3,3-bis(p-dimethylaminophenyl)-6-dimethylaminophthalide, 4-hydroxy-4'-dimethylaminotriphenylmethane lactone and 4,4'-bisdihydroxy-3,3'-bisdiaminotriphenylmethane lactone; indolyl phthalides such as 3-(4-diethylamino-2-ethoxyphenyl)-3-(1-ethyl-2-methylindol-3-yl)-4-azaphthalide, 3-(4-diethylaminophenyl)-3-(1-ethyl-2-methylindol-3-yl) phthalide, 3,3-bis(1-n-butyl-2-methylindol-3-yl)phthalide and 3,3-bis(1-ethyl-2-methylindol-3-yl)phthalide; fluorans such as 3-diethylamino-6-methyl-7-anilinofluoran, 3-dibutylamino-6-methyl-7-anilinofluoran, 3-diethylamino-6-methyl-7-xylidinofluoran, 3-dibutylamino-6-methyl-7-xylidinofluoran, 3-diethylamino-7-chloroanilinofluoran, 3-diethylamino-7,8-benzofluoran, 3,6-dimethoxyfluoran, 3-diethylamino-6-methoxy-7-aminofluoran, 3-diethylamino-7-benzylaminofluoran, 3-diethylamino-6-methylchlorofluoran, 3-dimethylamino-6-methoxyfluoran, 3,6-bis-β-methoxyethoxyfluoran, 3-diethylamino-6-methyl-7-chlorofluoran, 3,7-bisdiethylaminofluoran and 3-diethylamino-7-methoxyfluoran; Rhodamine lactams such as Rhodamine B anilinolactam, Rhodamine (p-nitroanilino) lactam and Rhodamine B (p-chloroanilino) lactam; spiropyrans such as 3-phenyl-8'-methoxybenzoindolinospiropyran, 8'-methoxybenzoindolinospiropyran, 4,7,8'-trimethoxybenzoindolinospiropyran, 3-methyl-spiro-dinaphthopyran, 3-ethyl-spiro-dinaphthopyran, 3,3'-dichloro-spirodinaphthopyran, 3-benzyl-spiro-dinaphthopyran and 3-methyl-naphtho-(3-methoxybenzo)-spiropyran; auramines such as 4,4'-bisdimethylamino-3,4-chlorophenylauramine and 4,4'-bisdimethylaminopiperazine hydrol; and phenothiazines such as p-methoxybenzoyl leucomethylene blue and 3,7-bis(dimethylamino)-10-benzoylphenothiazine.

In particular, phthalides and fluorans having a lactone skeleton with acid-dissociation property are preferred. These may be used alone or, as needed, may be used as a mixture of two or more of them.

The content of these organic dyes or their precursors is preferably from 1 to 20% by weight, more preferably from 3 to 10% by weight, based on the entire photosensitive layer composition. In case where the content is less than 1% by weight, there results an insufficient printing-out effect. On the other hand, in case where the content exceeds 20% by weight, there results a deteriorated durability.

The photosensitive layer in the lithographic printing plate precursor of the present invention includes, in addition to the above-described (E) organic dye or the precursor thereof, at least (A) an infrared ray-absorbing agent, (B) an onium salt, (C) a radically polymerizable compound and (D) a binder polymer. Each of these components is described successively below.

[(A) Infrared Ray-Absorbing Agent]

An object of the present invention is to record an image using a laser emitting infrared rays. For this purpose, it is necessary to use an infrared ray-absorbing agent. The infrared ray-absorbing agent functions to convert the absorbed infrared rays to heat. An onium salt is in turn decomposed by the thus generated heat to generate a radical. The infrared ray-absorbing agent to be used in the present invention is a dye or a pigment having an absorption maximum in the range of from 760 to 1200 nm in wavelength.

As dyes, commercially available dyes and known dyes described, for example, in "Dye Handbook" compiled by Yuki Gosei Kagaku Kyokai (1970) may be utilized. Specifically, azo dyes, metal complex salt azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium dyes, and metal thiolate may be illustrated.

Preferred dyes include, for example, cyanine dyes described in Japanese Patent (Application) Laid-Open Nos. 125246/1983, 84356/1984, 202829/1984 and 78787/1985; methine dyes described in Japanese Patent Laid-Open Nos. 173696/1983, 181690/1983 and 194595/1983; naphthoquinone dyes described in Japanese Patent Laid-Open Nos. 112793/1983, 224793/1983, 48187/1984, 73996/1984, 52940/1985 and 63744/1985; squarylium dyes described in Japanese Patent Laid-Open No. 112792/1983; and cyanine dyes described in British Patent 434,875.

Further, near infrared-absorbing sensitizing dyes described in U.S. Pat. No. 5,156,938 are also preferably used. In addition, substituted arylbenzo (thio) pyrylium salts described in U.S. Pat. No. 3,881,924, trimethine thiapyrylium salts described in Japanese Patent Laid-Open No. 142645/1982 (corresponding to U.S. Pat. No. 4,327,169), pyrylium based compounds described in Japanese Patent Laid-Open Nos. 181051/1983, 220143/1983, 41363/1984, 84248/1984, 84249/1984, 146063/1984 and 146061/1984, cyanine dyes described in Japanese patent Laid-Open No. 216146/1984, pentamethine thiopyrylium salts described in U.S. Pat. No. 4,283,475, and pyrylium compounds described in Japanese Patent Publication Nos. 13514/1993 and 19702/1993 are particularly preferably used as well.

As another examples of preferred dyes, there may be illustrated near infrared-absorbing dyes described in U.S. Pat. No. 4,756,993 as formulae (I) and (II).

Of these dyes, cyanine dyes, squarylium dyes, pyrylum salts and nickel thiolate complexes are preferred. The most preferred are cyanine dyes represented by the following general formula (I):

(I)

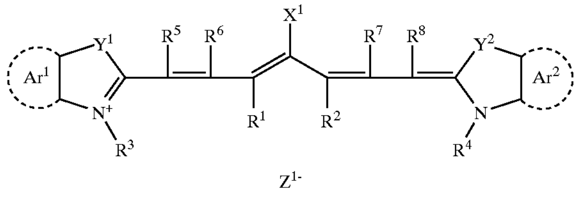

In the general formula (I), $X^1$ represents a halogen atom or $X^2$-$L^1$ (wherein $X^2$ represents an oxygen atom or a sulfur atom, and $L^1$ represents a hydrocarbon group containing 1 to 12 carbon atoms). $R^1$ and $R^2$ each independently represents a hydrocarbon group containing 1 to 12 carbon atoms. In view of storage stability of a photosensitive layer coating solution, $R^1$ and $R^2$ each preferably represents a hydrocarbon group containing 2 or more carbon atoms and, more preferably, $R^1$ and $R^2$ are bonded to each other to form a 5-membered or 6-membered ring.

$Ar^1$ and $Ar^2$ may be the same or different from each other, and each represents an aromatic hydrocarbon group which may optionally have a substituent or substitutents. Preferred aromatic hydrocarbon groups include a benzene ring and a naphthalene ring. Also, preferred substituents include a hydrocarbon group containing 1 to 12 carbon atoms, a halogen atom, and an alkoxy group containing 12 or less carbon atoms. $Y^1$ and $Y^2$ may be the same or different from each other, and each represents a sulfur atom or a dialkylmethylene group containing 12 or less carbon atoms. $R^3$ and $R^4$ may be the same or different from each other, and each represents a hydrocarbon group which may optionally have a substituent or substituents and which contains 20 or less carbon atoms. Preferred substituents include an alkoxy group containing 12 or less carbon atoms, a carboxyl group and a sulfo group. $R^5$, $R^6$, $R^7$ and $R^8$ may be the same or different from each other, and each represents a hydrogen atom or a hydrocarbon group containing 12 or less carbon atoms. In view of availability of starting materials, a hydrogen atom is preferred. $Z^{1-}$ represents a counter ion, provided that, when one of R1 to R8 has a sulfo group as a substituent, $Z^{1-}$ is not necessary. In view of storage stability of a photosensitive layer coating solution, $Z^{1-}$ preferably represents a halide ion, a perchlorate ion, a tetrafluoroborate ion, a hexafluorophosphate ion or a sulfonate ion, with a perchlorate ion, a hexafluorophosphate ion and an arylsulfonate ion being particularly preferred.

Specific examples of the cyanine dyes which are represented by the general formula (I) and are preferably used in the present invention include those described in paragraphs [0017] to [0019] of Japanese Patent Laid-Open No. 133969/2001.

As pigments to be used in the present invention, there may be utilized commercially available pigments and those pigments which are described in Color Index (C.I.), "The latest Pigment Handbook" compiled by Nihon Ganryo Gijutsu Kyokai (1977), "The Latest Pigment Applied Technique" published by CMC Publishing Co. (1986) and "Printing Ink Technique" published by CMC Publishing Co. (1984).

Examples of the pigments include black pigments, yellow pigments, orange pigments, brown pigments, red pigments, purple pigments, blue pigments, green pigments, fluorescent pigments, metal powder pigments and polymer-bonding pigments. Specifically, insoluble azo pigments, azo lake pigments, condensation azo pigments, chelate azo pigments, phthalocyanine pigments, anthraquinone pigments, perylene and perinone pigments, thioindigo pigments, quinacridone pigments, dioxazine pigments, isoindolinone pigments, quinophthalone pigments, in-mold lake pigments, azine pigments, nitroso pigments, nitro pigments, natural pigments, fluorescent pigments, inorganic pigments and carbon black.

These pigments may be used without surface treatment or may be surface-treated. As methods of surface treatments, a method of surface-coating with resins and waxes, a method of adhering surfactants, and a method of bonding reactive substances (e.g., silane coupling agents, epoxy compounds and polyisocyanates) on the surface of pigments can be illustrated. These surface treatment methods are described in "Natures and Application of Metal Soaps" published by Saiwai Shobo Co., "Printing Ink Technique" published by CMC Publishing Co. (1984) and "The Latest Pigment Applied Technique" published by CMC Publishing Co. (1986).

The particle size of pigments is preferably from 0.01 μm to 10 μm, more preferably from 0.05 to 1 μm, particularly preferably from 0.1 to 1 μm. Particle size of pigments of less than 0.01 μm is not preferred from the viewpoint of the stability of the dispersion in a photosensitive layer coating solution while, in case where it exceeds 10 μm, it is not preferred in view of the uniformity of the photosensitive layer.

As dispersing methods of pigments, methods known in the manufacture of inks and toners may be used. Examples of dispersing apparatus include an ultrasonic dispersing apparatus, a sand mill, an attritor, a pearl mill, a super-mill, a ball mill, an impeller mill, a disperser, a KD mill, a colloid mill, a dynatron, a three-roll mill, a pressure kneader, etc. Details are described in "The Latest Pigment Applied Technique" published by CMC Publishing Co.

These infrared ray-absorbing agents may be added to one and the same layer as other components are added to, or another layer may be provided to which they are added. However, it is preferred that, in preparing a negative-working lithographic printing plate precursor, the optical density of the photosensitive layer at the absorption maximum in a range of from 760 nm to 1200 nm be in the range of from 0.1 to 3.0. In case where the optical density is outside the range, there tends to result a low sensitivity. Since the optical density depends upon the addition amount of the aforesaid infrared ray-absorbing agent and the thickness of the recording layer, a predetermined optical density can be obtained by properly controlling these factors. The optical density of the recording layer can be measured in a conventional manner. As the measuring method, there are illustrated, for example, a method of forming on a transparent or white support a recording layer by coating the layer solution in a dry coating amount to have a thickness properly determined within a range necessary as a lithographic printing plate, followed by measuring by means of a transmission type optical densitometer, and a method of forming a recording layer on a reflective support such as aluminum and measuring the reflection density.

These infrared ray-absorbing agents may be added to the image-recording material in an amount of from 0.01 to 50% by weight (i.e. by mass), preferably from 0.1 to 20% by weight, particularly preferably from 1 to 10% by weight, based on the entire solid contents of the image-recording material. In case where the addition amount is less than 0.01% by weight, there results a lowered sensitivity whereas, in case where it exceeds 50% by weight, stains are formed in non-image areas upon printing.

[(B) Onium Salts]

In the present invention, the onium salts exhibit a radical-generating function and a function of color-changing the dye precursor with an acid in a well-balanced manner. Examples of preferably used onium salts include iodonium salts, diazonium salts and sulfonium salts.

Examples of the onium salt to be particularly preferably used in the present invention are those onium salts which are represented by the following general formulae (III) to (V):

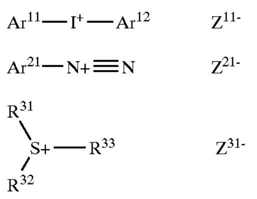

(III)

(IV)

(V)

In the formula (III), $Ar^{11}$ and $Ar^{12}$ each independently represents an aryl group which may have a substituent or substituents and which contains 20 or less carbon atoms. Preferred examples of the substituents in the case where the aryl group is substituted include a halogen atom, a nitro group, an alkyl group containing 12 or less carbon atoms, an alkoxy group containing 12 or less carbon atoms, and an aryloxy group containing 12 or less carbon atoms. $Z^{11-}$ represents a counter ion selected from the group consisting of halide ion, perchlorate ion, tetrafluoroborate ion, hexafluorophosphate ion and sulfonate ion, with perchlorate ion, hexafluorophosphate ion and arylsulfonate ion being preferred.

In the formula (IV), $Ar^{21}$ represents an aryl group which may have a substituent or substituents and which contains 20 or less carbon atoms. Preferred examples of the substituents include a halogen atom, a nitro group, an alkyl group containing 12 or less carbon atoms, an alkoxy group containing 12 or less carbon atoms, an aryloxy group containing 12 or less carbon atoms, an alkylamino group containing 12 or less carbon atoms, a dialkylamino group containing 12 or less carbon atoms, an arylamino group containing 12 or less carbon atoms, and a diarylamino group containing 12 or less carbon atoms. $Z^{21-}$ represents the same counter ion as $Z^{11-}$.

In the general formula (V), $R^{31}$, $R^{32}$ and $R^{33}$ may be the same or different from each other, and each represents a hydrocarbon group which may have a substituent or substituents and which contains 20 or less carbon atoms. Preferred examples of the substituents include a halogen atom, a nitro group, an alkyl group containing 12 or less carbon atoms, an alkoxy group containing 12 or less carbon atoms, and an aryloxy group containing 12 or less carbon atoms. $Z^{31-}$ represents the same counter ion as $Z^{11-}$.

Specific examples of the onium salts to be preferably used in the present invention include those described in paragraphs [0030] to [0033] in Japanese Patent Laid-Open No. 133969/2001.

The onium salts to be used in the present invention show the maximum absorption wavelength in the range of preferably 400 nm or less, more preferably 360 nm or less. Such absorption wavelength in the UV region permits to handle the lithographic printing plate precursor under a white light.

These onium salts may be added to the photosensitive layer-coating solution in an amount of from 0.1 to 50% by weight (i.e., by mass), preferably from 0.5 to 30% by weight, particularly preferably from 1 to 20% by weight, based on the entire solid contents of the photosensitive layer-coating solution. In case where the addition amount is less than 0.1% by weight, there results a lowered sensitivity whereas, in case where it exceeds 50% by weight, stains are formed in non-image areas upon printing. These onium salts may be added to one and the same layer as other components are added to, or another layer may be provided to which they are added.

[(C) Radically Polymerizable Compound]

The radically polymerizable compounds to be used in the present invention are radically polymerizable compounds having at least one ethylenically unsaturated double bond, and are selected from among those compounds which have at least one, preferably two or more, terminal ethylenically unsaturated bonds. Such compounds are widely known in this industrial field and, in the present invention, they maybe used with no particular limitation. These are in a chemical form of, for example, monomer, prepolymer, i.e., dimer, trimer or oligomer, or a mixture or a copolymer thereof. Examples of the monomers and the copolymers thereof include unsaturated carboxylic acids (e.g., acrylic acid, methacrylic acid, itaconic acid, crotonic acid, isocrotonic acid and maleic acid) and esters thereof and amides thereof. Preferably, esters between unsaturated carboxylic acid and aliphatic polyhydric alcohol compound and amides between unsaturated carboxylic acid and aliphatic polyvalent amine are used. In addition, unsaturated carboxylic acid esters having a nucleophilic substituent such as a hydroxyl group, an amino group or a mercapto group; addition reaction products between an amide and a monofunctional or polyfunctional isocyanate or an epoxy compound; and dehydration condensation reaction products between an amide and a monofunctional or polyfunctional carboxylic acid are preferably used as well. Further, addition reaction products between an unsaturated carboxylic acid ester or amide having an electrophilic substituent such as an isocyanate group or an epoxy group and a monofunctional or polyfunctional alcohol, an amine or a thiol; and substitution reaction products between an unsaturated carboxylic acid ester or amide having an releasing substituent such as a halogen atom or a tosyloxy group and a monofunctional or polyfunctional alcohol, amine or thiol are also preferred. Alternatively, a group of compounds prepared by replacing the unsaturated carboxylic acid described above by an unsaturated phosphonic acid or styrene may also be used.

Specific examples of the esters between an aliphatic polyhydric alcohol compound and an unsaturated carboxylic acid as the radically polymerizable compounds, i.e., acrylic esters, methacrylic esters, itaconic esters, crotonic esters, isocrotonic esters and maleic esters are described in paragraphs [0037] to [0042] in Japanese Patent Laid-Open No. 1339969/2001, and they are also applicable to the present invention.

As other esters, aliphatic alcohol esters described in Japanese Patent Publication Nos. 27926/1971 and 47334/1976, Japanese Patent Laid-Open No. 196231/1982; those which have an aromatic skeleton and are described in Japanese Patent Laid-Open Nos. 5240/1984, 5241/1984 and 226149/1990; and those which have an amino group and are described in Japanese Laid-Open No. 165613/1989 are also preferably used.

Specific examples of the monomers of amides between an aliphatic polyvalent amine compound and an unsaturated carboxylic acid include methylenebis-acrylamide, methylenebis-methacrylamide, 1,6-hexamethylenebis-acrylamide, 1,6-hexamethylenebis-methacrylamide, diethylenetriaminetrisacrylamide, xylylenebisacrylamide and xylylenebismethacrylamide.

As other preferred examples of the amide monomer, there are illustrated those which have a cyclohexylene structure and are described in Japanese Patent Publication No. 21726/1979.

Also, urethane-based addition polymerizable compounds prepared by using addition reaction between an isocyanate and a hydroxyl group are exemplified, and as specific examples thereof, there are illustrated those vinylurethane compounds having two or more polymerizable vinyl groups with in the molecule which are described in Japanese Patent Publication No. 41708/1973 and are prepared by adding a hydroxyl group-having vinyl monomer represented by the following formula (VI) to a polyisocyanate compound having two or more isocyanate groups per molecule.

$$CH_2{=}C(R^{41})COOCH_2CH(R^{42})OH \qquad \text{General Formula (VI)}$$

(wherein $R^{41}$ and $R^{42}$ each represents H or $CH_3$)

Also, urethaneacrylates as described in Japanese Patent Laid-Open No. 37193/1976 and Japanese Patent Publication Nos. 32293/1990 and 16765/1990 and urethane compounds which are described in Japanese Patent Publication Nos. 49860/1983, 17654/1981, 39417/1987 and 39418/1987 and have an ethylene oxide-based skeleton are preferred.

Further, those radically polymerizable compounds may be used which are described in Japanese Patent Laid-Open Nos. 277653/1988, 260909/1988 and 105238/1989 and have an amino structure or a sulfide structure within the molecule.

As other examples, there may be illustrated polyfunctional acrylates and methacrylates such as polyester acrylates and epoxyacrylates obtained by reacting an epoxy resin with (meth)acrylic acid as described in Japanese Patent Laid-Open No. 64183/1973 and Japanese Patent Publication Nos. 43191/1974 and 30490/1977. Further, there may be illustrated specific unsaturated compounds described in Japanese patent Publication Nos. 43946/1971, 40337/1989 and 40336/1989 and vinylsulfonic acid compounds described in Japanese Patent Laid-Open No. 25493/1990. In addition, in some cases, a structure containing a perfluoroalkyl group described in Japanese Patent Laid-Open No. 22048/1986 is preferably used. Still further, those which are introduced as photocurable monomers and oligomers in Nihon Secchaku Kyokai-Shi, vol. 20, No. 7, pp. 300 to 308 (1984) may also be used.

Details of use of these radically polymerizable compounds on, for example, what structure is to be used, whether to use alone or in combination thereof and what amount is to be employed, can freely be selected depending upon designed performance of the final recording material. For example, the selection is made from the following viewpoints. In view of sensitivity, a structure wherein the content of unsaturated group per molecule is larger is preferred. In many cases, two or more functional groups are preferred per molecule. In addition, in order to enhance strength of image areas, i.e., cured film, those compounds which have three or more functional groups are preferred. Further, a method of adjusting both sensitivity and strength by using in combination compounds different in number of the functional groups and different in kind of polymerizable group (for example, an acrylic ester compound, a methacrylic ester compound and a styrenic compound) is effective as well. Compounds having a larger molecular weight and compounds having a high hydrophobicity show excellent sensitivity and film strength, but are in some cases unfavorable in the point of developing speed and precipitation in a developing solution. Also, selection and use of the radically polymerizable compound are important factors for compatibility and dispersibility with other components in the photosensitive layer (e.g., binder polymers, initiators and colorants). For example, use of a compound having a low purity or use of two or more of the compounds can in some cases improve compatibility. It is also possible to select a specific structure for the purpose of improving adhesion properties to a support or an overcoat layer. As to mixing ratio of the radically polymerizable compound in the image-recording layer, the more the ratio, the more advantageous in the point of sensitivity. However, when compounded too much, there might result an unfavorable phase separation or arise a problem in production steps due to adhesive property of the image-recording layer (for example, production failure due to transfer and adhesion of the components of the recording layer) and a problem of precipitation from the developing solution. From these viewpoints, preferred content of the radically polymerizable compounds is in many cases 5 to 80% by weight, preferably 20 to 75% by weight, based on the entire components of the composition. These compounds may be used alone or in combination of two or more thereof. In addition, with respect to the use of radically polymerizable compounds, proper structure, compounding and addition amount may freely be selected in view of the degree of polymerization inhibition with oxygen, resolving power, fogging properties, change in refractive index and surface adhesive property and, in some cases, there may be employed a stratum structure of undercoat and topcoat and a coating method of undercoating and topcoating.

[(D) Binder Polymer]

In the present invention, a binder polymer is further used. As the binder, linear organic polymers are preferred to use. As such "linear organic polymers", any linear organic polymer maybe used. In order to enable development with water or weakly alkaline aqueous solution, it is preferred to select linear organic polymers which are soluble or swellable in water or weakly alkaline aqueous solution. The linear organic polymers are selected to use not only as a film-forming agent for forming a photosensitive layer but in view of the developability for water, a weakly alkaline aqueous solution or an organic solvent. As such linear organic polymers, there are illustrated radical polymers having carboxylic acid groups in side chains described in, for example, Japanese Patent Laid-Open No. 44615/1984, Japanese Patent Publication Nos. 34327/1979, 12577/1983 and 25957/1979, and Japanese Patent Laid-Open Nos. 92723/1979, 53836/1984 and 71048/1984, i.e., methacrylic acid copolymers, acrylic acid copolymers, itaconic acid copolymers, crotonic acid copolymers, maleic acid copolymers and partially esterified maleic acid copolymers. Also, acidic cellulose derivatives having carboxylic acid groups in side chains are illustrated. Further, those which are prepared by adding a cyclic anhydride to a hydroxyl group-having polymer are also useful.

Of these, (meth) acryl resins having benzyl or allyl groups and carboxyl groups in the side chains have well-balanced film thickness, sensitivity and developability, thus being preferred.

Also, urethane-based binder polymers having acid groups, which are described in Japanese Patent Publication Nos. 12004/1995, 120041/1995, 120042/1995 and 12424/1996, Japanese Patent Laid-Open Nos. 287947/1988 and 271741/1989, have such an excellent strength that they are advantageous in the point of durability and low exposure adaptability.

In addition to these polymers, polyvinylpyrrolidone and polyethylene oxide are useful as water-soluble linear organic polymers. In order to raise strength of cured film, alcohol-soluble nylons and a polyether between 2,2-bis-(4-hydroxyphenyl)-propane and epichlorohydrin are also useful.

The weight average molecular weight of the polymer to be used in the present invention is preferably 5,000 or more, more preferably in the range of from 10,000 to 300,000, and the number average molecular weight is preferably 1,000 or more, more preferably in the range of from 2,000 to 250,000. The polydisperse degree (weight average molecular weight/number average molecular weight) is preferably 1 or more, more preferably in the range of from 1.1 to 10.

These polymers may be any of random copolymers, block polymers and graft polymers, with random polymers being preferred.

The polymers to be used in the present invention may be synthesized by conventionally known methods. Solvents to be used upon synthesis include, for example, tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethylsulfoxide and water. These solvents are used alone or as a mixture of two or more thereof.

As the radical polymerization initiators to be used in the present invention upon synthesis of the polymers, well-known compounds such as azo type initiators and peroxide type initiators may be used.

The binder polymers to be used in the present invention may be used alone or in combination thereof. These polymers are added to the photosensitive layer in a content of 20 to 95% by weight, preferably 30 to 90% by weight, based on the entire solid contents of the photosensitive layer-coating solution. In case where the content is less than 20% by weight, there results an insufficient strength in image areas of a formed image. Also, in case where the content exceeds 95% by weight, no images are formed. The ratio of the radically polymerizable compound having an ethylenically unsaturated double bond or bonds to the linear organic polymer is preferably in the range of from 1/9 to 7/3 by weight.

[Other Components of the Photosensitive Layer]

In the present invention, various compounds may further be added in addition to these compounds as needed.

For example, heat base generators may be added, if desired. As the heat base generators, salts between an organic acid and a base, capable of undergoing decarboxylation to decompose upon heating; compounds capable of undergoing intramolecular nucleophilic substitution reaction, Lossen rearrangement reaction or Beckmann rearrangement reaction to decompose and release an amine; and compounds capable of causing a particular reaction upon heating to release a base, are preferred. For example, there may be illustrated guanidine trichloroacetate, methylguanidine trichloroacetate, potassium trichloroacetate, guanidine phenylsulfonylacetate, guanidine p-chlorophenylsulfonylacetate, guanidine p-methanesulfonylphenylsulfonylacetate, potassium phenylpropiolate, guanidine phenylpropiolate, cesium phenylpropiolate, guanidine p-chlorophenylpropiolate, guanidine p-phenylene-bis-phenylpropiolate, tetramethylammonium phenylsulfonylacetate, tetramethylammonium phenylpropiolate, nitrobenzyl cyclohexyl carbamate and di(methoxybenzyl) hexamethylene dicarbamate.

In the present invention, it is preferred to add a small amount of thermal polymerization inhibitor in order to inhibit unnecessary thermal polymerization of the compound having a radically polymerizable, ethylenically unsaturated double bond or bonds during preparation or storage of the photosensitive layer-coating solution. Examples of suitable thermal polymerization inhibitors include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol) and N-nitroso-N-phenylhydroxylamine aluminum salt. The addition amount of the thermal polymerization initiator is preferably from about 0.01% by weight to about 5% by weight, based on the weight of the whole composition. Also, if necessary, higher fatty acid derivatives such as behenic acid and behenic acid amide may be added to localize in the surface portion of the photosensitive layer in the step of drying after coating for the purpose of preventing inhibition of polymerization with oxygen. The addition amount of the higher fatty acid derivative is preferably from about 0.1% by weight to about 10% by weight, based on the weight of the entire composition.

In addition, to the photosensitive layer-coating solution of the present invention may be added nonionic surfactants as described in Japanese Patent Laid-Open Nos. 251740/1987 and 208514/1991, and amphoteric surfactants as described in Japanese Patent Laid-Open Nos. 121044/1984 and 13149/1992 for the purpose of increasing stability of processing for developing conditions.

Specific examples of the nonionic surfactants include sorbitan tristearate, sorbitan monopalmitate, sorbitan trioleate, stearic acid monoglyceride and polyoxyethylene nonylphenyl ether.

Specific examples of the amphoteric surfactants include alkyldi(aminoethyl)glycine, alkylpolyaminoethylglycine hydrochloride, 2-alkyl-N-carboxyethyl-N-hydroxyethylimidazolinium betaine and N-tetradecyl-N,N-betaine type surfactants (e.g., trade name "Amorgen K"; made by Daiichi Kogyo Seiyaku Co., Ltd.).

The content of the nonionic surfactant and the amphoteric surfactant in the photosensitive layer-coating solution is preferably from 0.05 to 15% by weight, more preferably from 0.1 to 5% by weight.

Further, to the photosensitive layer-coating solution of the present invention is added, if necessary, a plasticizer for imparting flexibility to a coating film. For example, there may be used polyethylene glycol, tributyl citrate, diethyl phthalate, dibutyl phthalte, dihexyl phthalate, dioctyl phthalate, tricresyl phosphate, tributyl phosphate, trioctyl phosphate and tetrahydrofurfuryl oleate.

In producing the lithographic printing plate precursor of the present invention, it suffices to dissolve in a solvent the above-described components necessary for the photosensitive layer-coating solution and coat the solution on a suitable support. As the solvent to be used here, there may be illustrated ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene and water, though not limitative at all. These solvents may be used alone or as a mixture thereof. The concentration of the above components (entire solid contents including the additives) in the solvent is preferably 1 to 50% by weight.

The coating amount of the photosensitive layer on the support obtained after coating and drying (solid content) is varied depending upon the end-use, but is generally 0.5 to 5.0 $g/m^2$ as to the lithographic printing plate precursor. Various coating methods may be employed as coating methods, and there may be illustrated, for example, bar coating, rotary coating, spray coating, curtain coating, dip coating, air knife coating, blade coating and roll coating. As the coating amount decreases, apparent sensitivity increases, but film characteristics of the photosensitive layer which functions to record an image are deteriorated.

To the heat-sensitive layer-coating solution may be added a surfactant for improving coating properties, such as a fluorine-containing surfactant as described in Japanese Patent Laid-Open No. 170950/1987. The addition amount is preferably from 0.01 to 1% by weight, more preferably from 0.05 to 0.5% by weight, based on the solid contents in the entire photosensitive layer.

[Support]

The support of the lithographic printing plate precursor of the present invention on which the photosensitive layer can be coated is a plate having dimensional stability and is exemplified by paper; paper laminated with plastics (e.g., polyethylene, polypropylene or polystyrene); metal plats (e.g., aluminum, zinc or copper); plastic films (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal) and paper or plastic films laminated or deposited with metals as described above. Preferred examples of the support include polyester films and aluminum plates.

As the support to be used for the lithographic printing plate precursor of the present invention, aluminum plates are preferably used which are light-weight and show excellent surface processability, workability and corrosion resistance. As the aluminum materials suited for this purpose, there are illustrated JIS 1050 material, JIS 1100 material, JIS 1070 material, Al-Mg-based alloy, Al-Mn-based alloy, A-Mn-Mg-based alloyl, Al-Zr-based alloy and Al-Mg-Si-based alloy.

The aluminum plate having a predetermined thickness of 0.1 to 0.5 mm may be subjected to a correcting apparatus such as a roller leveler or a tension leveler in order to improve flatness. Accuracy of the thickness of the plate is within ±10 μm, preferably ±6 μm all over the full length of coil. Also, difference in thickness of the plate in the transverse direction is within 6 μm, preferably within 3 um. Surface roughness of the Al plate is liable to be influenced by the surface roughness of rolling rolls, but is preferably finished to about 0.1 to 1.0 μm in center line surface roughness (Ra). In case where Ra is too large, the original roughness of Al, i.e., rough pressure traces transferred by the rolling rolls, are viewed through the photosensitive layer after the Al plate is subjected to roughening treatment required for lithographic printing plate and coating treatment of the photosensitive layer, thus not being preferred in view of appearance. On the other hand, roughness of 0.1 μm or less in terms of Ra requires to finish the surface of rolling rolls to an extremely low roughness, thus not being industrially desirable.

The Al plate is subjected to surface treatment such as roughening treatment, then coated with a photosensitive layer to form a lithographic printing plate. The roughening treatment includes mechanical roughening treatment, chemical roughening treatment and electrochemical roughening treatment, which are conducted alone or in combination thereof. It is also preferred to conduct anodic oxidation treatment for ensuring resistance against surface scratching or a treatment for enhancing hydrophilicity.

Surface treatment of the support is described below.

Prior to the surface roughening of the aluminum plate, degreasing is performed to remove the rolling oil on the surface of the plate using, for example, surfactants, organic solvents or alkaline aqueous solution, if required. In the case of using an alkaline aqueous solution, neutralizing treatment with an acidic solution to neutralize and remove smut may be conducted.

Subsequently, in order to improve adhesion between the support and the photosensitive layer and impart water-retaining properties to non-image areas, treatment of roughening the surface of support, called graining treatment, is conducted. As specific means for this graining treatment, there are mechanical graining methods such as a sand blasting method, a ball graining method, a wire graining method, a brush graining method using a nylon brush and an abrasive/water slurry, and a honing graining of blowing an abrasive/water slurry to the surface with a high pressure; and chemical graining methods such as a method of treating the surface with an etching agent composed of an alkali, an acid or a mixture thereof. In addition, there are known electrochemical graining methods, a combination of a mechanical graining method and an electrochemical graining method, and a combination of a mechanical graining method and a chemical graining method using an aqueous solution saturated with an aluminum salt of mineral acid. Further, a method of adhering granules to the support material using an adhesive or means of the same effect to thereby roughen the surface and a method of pressing the support material against a continuous sheet or roll having fine unevenness on the surface to thereby transfer the unevenness to the surface of the support and form a roughened surface.

These roughening methods may be combined, with freely selecting the order and the repeating times. In the case of conducting a plurality of the roughening treatments, a chemical treatment with an acid or an alkali aqueous solution may be conducted between two treatments in order to uniformly conduct a subsequent roughening treatment.

Specific examples of the acid or the alkaline aqueous solution include acids such as hydrofluoric acid, zirconium acid fluoride, phosphoric acid, sulfuric acid, hydrochloric acid and nitric acid; and aqueous solutions of alkali such as sodium hydroxide, sodium silicate or sodium carbonate. These acids or the alkaline aqueous solutions may respectively be used alone or in combination of two or more. The chemical treatment is generally conducted at a solution temperature of 40° C. to 100° C. for 5 to 300 seconds using a 0.05 to 40% by weight aqueous solution of these acids or alkalis.

Since smut is generated on the surface of the support having been subjected to the aforesaid roughening treatment, i.e., graining treatment, it is generally preferred to conduct washing with water or a treatment such as alkali etching.

With the aluminum support to be used in the present invention, anodic oxidation is conducted after the aforesaid pre-treatment to form an oxide film on the support for the purpose of improving abrasion resistance, chemical resistance and water-retaining properties.

As electrolytes to be used in the anodic oxidation treatment of an aluminum plate, any electrolyte may be used that serves to form a porous oxide film. In general, sulfuric acid, phosphoric acid, oxalic acid, chromic acid or a mixed acid of these is used. The concentration of the electrolyte is properly determined depending upon the kind of the electrolyte. Treatment conditions of the anodic oxidation cannot be determined in a general manner as the conditions fluctuate variously depending upon the electrolytic solution to be used, but generally appropriately the concentration of the electrolyte is from 1 to 80% by weight, temperature of the solution is from 5 to 70° C., electric current density is from 5 to 60 $A/dm^2$, voltage is from 1 to 100 V, and electrolytic time is from 10 seconds to 5 minutes. The amount of anodic oxidation film is preferably 1.0 $g/m^2$ or more, more preferably in the range of from 2.0 to 6.0 $g/m^2$. In case where the amount of anodic oxidation film is less than 1.0 $g/m^2$, there results an insufficient durability and the non-image areas of the lithographic printing plate is liable to be scratched and, as a result, "scratch stain", i.e., adhesion of ink at that scratch, is liable to occur.

After the anodic oxidation treatment, the aluminum support of the present invention may be subjected to a treatment with an organic acid or its salt or to formation of an undercoat layer containing the organic acids for the photosensitive layer. Examples of usable organic acids or the salts thereof include organic carboxylic acids, organic phosphonic acids, organic sulfonic acids and the salts thereof, with organic carboxylic acids or the salts thereof being preferred. As the organic carboxylic acids, there are illustrated aliphatic monocarboxylic acids such as formic acid, acetic acid, propionic acid, butyric acid, lauric acid, palmitic acid and stearic acid; unsaturated aliphatic monocarboxylic acids such as oleic acid and linoleic acid; aliphatic dicarboxylic acids such as oxalic acid, succinic acid, adipic acid and maleic acid; hydroxycarboxylic acids such as lactic acid, gluconic acid, malic acid, tartaric acid and citric acid; and aromatic carboxylic acids such as benzoic acid, mandelic acid, salicylic acid and phthalic acid. Salts thereof include salts of metals of the groups 1, 4, 8 to 10, 12, 13 and 16 in the periodic table and ammonium salts. Of the salts of organic carboxylic acids, the above-described metal salts and ammonium salts of formic acid, acetic acid, butyric acid, propionic acid, lauric acid, oleic acid, succinic acid and benzoic acid are preferred. These compounds may be used alone or in combination of two or more thereof.

These compounds are preferably dissolved in water or an alcohol in a concentration of 0.001 to 10% by weight, particularly preferably 0.01 to 1.0% by weight and, as treating conditions, the support is immersed in the solution at 25 to 95° C., preferably 50 to 95° C., at a pH of 1 to 13, preferably 2 to 10, for 10 seconds to 20 minutes, preferably 10 seconds to 3 minutes or, alternatively, the treating solution is coated on the support.

In addition, after the anodic oxidation treatment, treatment with a solution of the following compound may be conducted, or such compound may be used as an undercoat layer for coating the photosensitive layer. As such compounds to be preferably used, there are illustrated, for example, organic phosphonic acids such as phenylphosphonic acid, naphthylphosphonic acid, alkylphosphonic acid, glycerophosphonic acid methylenediphosphonic acid and ethylenediphosphonic acid, which may optionally be substituted; organic phosphoric acids such as phenylphosphoric acid, naphthylphosphoric acid, alkylphosphoric acid and glycerophosphoric acid, which may optionally be substituted; organic phosphinic acids such as phenylphosphinic acid, naphthylphosphinic acid, alkylphosphinic acid and glycerophosphinic acid, which may optionally be substituted; amino acids such as glycine, β-alanine, valine, serine, threonine, aspartic acid, glutamic acid, arginine, lisine, triptophane, p-hydroxyphenylglycine, dihydroxyethylglycine and anthranilic acid; aminosulfonic acids such as sulfamic acid and cyclohexylsulfamic acid; and aminophosphonic acids such as 1-aminomethylphosphonic acid, 1-dimethylaminoethylphosphonic acid, 2-aminoethylphosphonic acid, 2-aminopropylphosphonic acid, 4-aminophenylphosphonic acid, 1-aminoethane-1,1-diphosphonic acid, 1-amino-1-phenylmethane-1,1-diphosphonic acid, 1-dimethylaminoethane-1,1-diphosphonic acid, 1-dimethylaminobutane-1,1-diphosphonic acid and ethylenediaminetetramethylenephosphonic acid.

Also, salts between hydrochloric acid, sulfuric acid, nitric acid, sulfonic acid (e.g., methanesulfonic acid) or oxalic acid and an alkali metal, ammonia, a lower alkanolamine (e.g., triethanolamine) or a lower alkylamine (e.g., triethylamaine) may preferably be used.

Water-soluble polymers such as polyacrylamide, polyvinyl alcohol, polyvinylpyrrolidone, polyethyleneimine and the mineral acid salt thereof, poly (meth) acrylic acid and the metal salt thereof, polystyrenesulfonic acid and the metal salt thereof, alkyl (meth)acrylates, 2-acrylamido-2-methyl-1-propanesulfonic acid and the metal salt thereof, trialkylammonium methylstyrene chloride polymer and its copolymer with (meth)acrylic acid, and polyvinylphosphonic acid may also preferably be used.

Further, soluble starch, carboxymethyl cellulose, dextrin, hydroxyethyl cellulose, gum arabic, Guar gum, sodium alginate, gelatin, glucose and sorbitol may also be preferably used. These compounds may be used alone or in combination of two or more of them.

In the treatment, these compounds are preferably dissolved in water and/or methyl alcohol in a concentration of 0.001 to 10% by weight, particularly 0.01 to 1.0% by weight. As to treating conditions, the support is immersed at a temperature of from 25° C. to 95° C., preferably from 50 to 95° C., at a pH of 1 to 13, preferably 2 to 10, for 10 seconds to 20 minutes, preferably 10 seconds to 3 minutes.

In the case of using as an undercoat layer for coating the photosensitive layer, the compounds are similarly dissolved in water and/or methyl alcohol in a concentration of 0.001 to 10% by weight, particularly 0.01 to 1.0% by weight and, if necessary, pH of the solution is adjusted to 1 to 12 with a basic substance such as ammonia, triethylamine or potassium hydroxide or an acidic substance such as hydrochloric acid or phosphoric acid. In addition, in order to improve tone reproducibility of the photosensitive lithographic printing plate, a yellow dye may be added thereto. The dry coated amount of the organic undercoat layer is suitably from 2 to 200 $mg/m^2$, preferably from 5 to 100 $mg/m^2$. In case where the coated amount is less than 2 $mg/m^2$, the essential effect of preventing stain cannot sufficiently be obtained. On the other hand, in case where the coated amount exceeds 200 mg/m2, there results a deteriorated durability.

Additionally, an interlayer may be provided for the purpose of enhancing adhesion between the support and the photosensitive layer. In order to improve adhesion, such interlayer comprises a diazo resin or a phosphoric acid compound capable of adsorbing onto aluminum. The thickness of the inter layer maybe arbitrary, but it must be a thickness capable of conducting, upon exposure, uniform bond-forming reaction with the upper photosensitive layer. Generally, the coated amount is about 1 to about 100 $mg/m^2$ as dry solids, with 5 to 40 $mg/m^2$ being particularly preferred. The amount of diazo resin in the interlayer is 30 to 100% by weight, preferably 60 to 100% by weight.

Prior to the above-described treatment and formation of the undercoat layer, the anodic oxidation-treated support may be subjected, after washing with water, to the following treatments for the purpose of inhibiting dissolution of the anodic oxidation film into the developing solution, inhibiting remaining of the photosensitive layer components, improving strength of the anodic oxidation film, improving hydrophilicity of the anodic oxidation film, and improving adhesion to the photosensitive layer.

One of the treatments is a silicate treatment of bringing the anodic oxidation film into contact with an alkali metal silicate aqueous solution. In this case, the concentration of the alkali metal silicate is 0.1 to 30% by weight, preferably 0.5 to 15% by weight. In the treatment, the support is brought into contact with the aqueous solution having a pH of 10 to 13.5 at 25° C., at a temperature of 5 to 80° C., preferably 10 to 70° C., more preferably 15 to 50° C. for 0.5 to 120 seconds. As to contacting method, any contacting method such as an immersing method or a spraying method may be employed. When pH of the alkali metal silicate aqueous solution is less than 10, the solution gelates whereas, when more than 13.5, the anodic oxidation film is dissolved away.

As other treatments, there are illustrated various pore-sealing treatments. There may be employed those methods which are generally known as treating methods for sealing pores of the anodic oxidation film, such as a method of sealing the pores with steam, a method of sealing the pores in boiled water (hot water), a method of sealing the pores with a metal salt (e.g., chromate/dichromate sealing, nickel acetate sealing, etc.), a method of sealing the pores with impregnation of oil and fat, a method of sealing the pores with a synthetic resin and a method of sealing the pores at low temperature (potassium ferricyanide, alkaline earth salt etc.). However, in view of performance as a support for printing plate (adhesion to a photosensitive layer or hydrophilicity), high-speed processing, low treatment cost and low environmental pollution, the method of sealing the pores with steam is comparatively preferred. Also, the support may be immersed in, or sprayed with, a nitrous acid solution in place of, or after, the pore-sealing treatment.

After the silicate treatment or pore-sealing treatment, treatment with an acidic aqueous solution and providing a hydrophilic undercoat as disclosed in Japanese Patent Laid-Open No. 278362/1993 or providing an organic layer as disclosed in Japanese Patent Laid-Open Nos. 282637/1992 and 314937/1995 may be conducted in order to enhance adhesion to the photosensitive layer.

After subjecting the support surface to the above-described treatments or undercoating the support, a back coat is provided on the backside of the support, as needed. As such back coat, a coating layer composed of the organic high molecular compound described in Japanese Patent Laid-Open No. 45885/1993 and a metal oxide obtained by hydrolysis and polycondensation of an organic or inorganic compound as described in Japanese Patent Laid-Open No. 35174/1994 are preferably used. Of these coating layers, coating layers of a metal oxide obtained from inexpensive, easily available silicon alkoxide compounds such as $Si(OCH_3)_4$, $Si(OC_2H_5)_4$, $Si(OC_3H_7)_4$ and $Si(OC_4H_9)_4$ show an excellent resistance against developing solutions, thus being particularly preferred.

With respect to characteristic properties required for the support preferable for lithographic printing plates, the support has a center line average roughness of 0.10 to 1.2 μm. In case where it is less than 0.10 μm, there results a deteriorated adhesion to the photosensitive layer, leading to serious deterioration of durability. In case where it is more than 1.2 um, there results deteriorated anti-stain properties upon printing. In addition, as to color density of the support, the support has a reflection density of 0.15 to 0.65. In case where it is whiter than 0.15, there results too strong halation upon imagewise exposure, thus causing troubles in image formation whereas, in case where it is blacker than 0.65, a formed image is difficult to view in the plate inspection work after development, thus suitability for plate inspection becoming seriously bad.

The lithographic printing plate precursor of the present invention can be obtained by forming a photosensitive layer, an overcoat layer and other optional layer on the resultant support having been subjected to the predetermined treatments as described hereinbefore. This lithographic printing plate precursor can be recorded by means of an infrared laser. In the present invention, it is preferred to conduct imagewise exposure by means of a solid state laser or a semiconductor laser irradiating infrared rays of 760 nm to 1200 nm in wavelength. The output of the laser is preferably 100 mW or more and, in order to shorten the exposure time, it is preferred to use a multi-beam laser device. Exposure time per pixel is preferably within 20 $\mu$ seconds. The energy to be irradiated to the recording material is preferably from 10 to 300 $mJ/cm^2$ After being exposed by means of an infrared laser, the image-recording material of the present invention is developed with, preferably, water or an alkaline aqueous solution.

In the case of using an alkaline aqueous solution as a developing solution, conventionally known alkaline aqueous solutions may be used as a developing solution and a replenisher for the image-recording material of the present invention. For example, there are illustrated inorganic alkali agents such as sodium silicate, potassium silicate, tertiary sodium phosphate, tertiary potassium phosphate, tertiary ammonium phosphate, secondary sodium phosphate, secondary potassium phosphate, secondary ammonium phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide and lithium hydroxide. Further, organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine.

These alkali agents may be used alone or in combination of two or more.

Further, it is known that, when development is conducted by using an automatic processor, a vast volume of lithographic printing plate precursors can be processed without replacing the developing solution in a developing tank for a long period of time, by the addition of an aqueous solution (replenisher) having a higher alkalinity than that of the developing solution to the developing solution. In the present invention, too, this replenishing system is preferably employed.

To the developing solution and the replenisher may be added various surfactants and organic solvents according to necessity for the purpose of accelerating or controlling development, dispersing developer scum and increasing the affinity of the image areas of a printing plate to ink. As preferred surfactants, there are illustrated anionic, cationic, nonionic, and amphoteric surfactants. As preferred organic solvents, there is illustrated benzyl alcohol. Also, addition of polyethylene glycol or the derivative thereof, or polypropylene glycol or the derivative thereof is preferred. Further, non-reducing sugars such as arabitol, sorbitol and mannitol may also be added.

Further, to the developing solution and the replenisher maybe added, if necessary, reducing agents such as hydroquinone, resorcin, salts of inorganic acid such as sodium salts or potassium salts of sulfurous acid and sulfurous acid hydroacid and, further, organic carboxylic acids, defoaming agents, and water softeners.

As the developing solution containing the surfactant, organic solvent and reducing agent, there are illustrated a developing solution composition which is described in Japanese Patent Laid-Open No. 77401/1976 and which comprises benzyl alcohol, an anionic surfactant, an alkali agent and water; a developing solution which is described in Japanese Patent Laid-Open No. 44202/1978 and which comprises an aqueous solution containing benzyl alcohol, an anionic surfactant and a water-soluble sulfite; and a developing solution composition which is described in Japanese Patent Laid-Open No. 155355/1980 and which contains an organic solvent showing a solubility for water of 10% by weight or less at ordinary temperature, an alkali agent and water. These are preferably used in the present invention as well.

The printing plate having been development processed with the above-described developing solution and the replelnisher is post-treated with a washing water, a rinsing water containing surfactants and a desensitizing solution containing gum arabic or starch derivatives. As the post-treatment to be employed in the case of using the image-recording material of the present invention as a printing plate, these treatments may be combined with each other in various manners.

In recent years, automatic processors for printing plates have come into wide use in the plate-making and printing field in order to standardize and rationalize plate-making works. The automatic processor generally comprises a developing part and a post-treating part, and is constituted by a printing plate-conveying device, tanks for solutions of respective treatments, and a spraying device. In the processor, an exposed printing plate is horizontally conveyed, during which respective treating solutions pumped up are blown against the plate through a spray nozzle to conduct development processing. Recently, it is also known to convey the printing plate in a state of being dipped in a treating solution fully charged in a tank by means of guide rolls. In such automatic processing, the processing can be conducted with replenishing respective treating solutions with replenishers depending upon the amount of treated printing plates and operation time. Automatic replenishing is also possible by detecting electroconductivity of the solution through a sensor.

In addition, a so-called disposable processing system is also applicable wherein the treatment is conducted using a substantially non-used processing solutions.

The thus-obtained lithographic printing plate can be offered to printing process after being coated, if necessary, with a desensitizing gum but, when a lithographic printing plate having a higher durability is desired, the plate is subjected to burning treatment.

In the case of burning the lithographic printing plate, it is preferred to treat the plate, prior to burning, with a (plate) burning conditioner as described in Japanese Patent Publication Nos. 2518/1986 and 28062/1980, Japanese Patent Laid-Open Nos. 31859/1987 and 159655/1986.

For that treatment, a method of coating a (plate) burning conditioner on the lithographic printing plate using sponge or absorbent cotton impregnated with the (plate) burning conditioner, or a method of coating by immersing the lithographic printing plate in a vat filled with a (plate) burning conditioner, or a method of coating by an automatic coater can be applied. Making the coating amount uniform by means of squeegee or squeegee rollers after coating provides more preferred results.

The coating amount of a (plate) burning conditioner is, in general, suitably from 0.03 to 0.8 g/m2 (by dry weight).

The lithographic printing plate coated with a (plate) burning conditioner is heated at high temperature, if necessary after drying, using a burning processor (e.g., Burning Processor BP-1300, commercially available from Fuji Photo Film Co., Ltd.). The heating temperature and time depend upon the kinds of components forming the image but are preferably from 180 to 300° C. and from 1 to 20 minutes.

The burning-treated lithographic printing plate can be properly subjected to conventional treatments as needed, such as washing with water and gumming but, when a (plate) burning conditioner containing water-soluble high molecular compounds is used, so-called desensitizing treatment such as gumming can be omitted.

A lithographic printing plate obtained through these processes is loaded on an offset printing machine and used for printing a lot of sheets.

EXAMPLE

The present invention is described in more detail by reference to examples, but the present invention is not construed as being limited thereto.

Example 1

[Preparation of a Support]

Molten metal of JIS A1050 containing not less than 99.5% of aluminum, 0.30% of Fe, 0.10% of Si, 0.02% of Ti and 0.013% of Cu was subjected to a cleaning treatment and casting. In the cleaning treatment, degassing was conducted for removing unnecessary gases such as hydrogen in the molten metal, followed by ceramic tube filtering. The casting was conducted according to DC casting method. The resultant solidified ingot plate of 500 mm in thickness was scalped in a depth of 10 mm from the surface and was subjected to a unifying treatment at 550° C. for 10 hours in order to avoid coarsening of a intermetallic compound. Then, the ingot was hot-pressed at 400° C., annealed at 500° C. for 60 seconds in a continuously annealing furnace, then cold-pressed to form a pressed aluminum web of 0.30 mm in thickness. The center line average surface roughness, Ra, of the cold-pressed aluminum web was adjusted to 0.2 $\mu$m by controlling the coarseness of rolling rolls. Subsequently, the web was subjected to a tension leveler in order to improve flatness.

Subsequently, surface treatment was conducted for preparing a support of a lithographic printing plate.

First, degreasing treatment was conducted at 50° C. for 30 seconds in a 10% by weight sodium aluminate aqueous solution for removing the rolling oil remaining on the surface of the aluminum, followed by neutralization with a 30% by weight sulfuric acid aqueous solution at 50° C. for 30 seconds and smut-removing treatment.

Then, so-called graining treatment of roughening the surface of the support was conducted in order to improve adhesion between the support and the photosensitive layer and impart water-retaining properties to non-image areas. Electrolytic graining was conducted by delivering the aluminum web into an aqueous solution containing 1% by weight of nitric acid and 0.5% by weight of aluminum nitrate and kept at 45° C. and giving an electric amount of 240° C./$dm^2$ on the anode side by means of an indirect feed cell with a current density of 20 A/$dm^2$ as an alternating wave of 1:1 in duty ratio. Then, etching treatment was conducted in a 10% by weight sodium aluminate aqueous solution at 50° C. for 30 seconds, followed by neutralization in a 30% by weight sulfuric acid aqueous solution at 50° C. for 30 seconds and smut-removing treatment.

Further, in order to improve abrasion resistance, chemical resistance and water-retaining properties, an oxide film was formed on the support by anodic oxidation. Electrolytic treatment was conducted by using a 20% by weight sulfuric acid aqueous solution at 35° C. as an electrolyte, and conveying the aluminum web through the electrolyte while applying a direct current of 14A/$dm^2$ by means of an indirect feed cell to thereby form a 2.5 g/$m^2$ anodic oxidation film.

In order to ensure hydrophilicity as non-image areas, the web was subjected to silicate treatment. The treatment was conducted by conveying the aluminum web through a 1.5% by weight disodium trisilicate aqueous solution kept at 70° C. so that contact time was controlled to be 15 seconds, followed by washing with water. The amount of deposited Si was 10 mg/$m^2$. The resultant support was 0.25 $\mu$m in Ra (center line surface roughness).

{Undercoating}

Subsequently, the following undercoating solution was coated on the aluminum support using a wire bar, and dried at 90° C. for 30 seconds using a warm air drier. The dry coated amount was 10 mg/$m^2$. [Undercoating solution]

| | |
|---|---|
| Copolymer between ethyl methacrylate and sodium 2-acrylamido-2-methyl-1-propanesulfonate (75:15 in molar ratio) | 0.1 g |
| 2-Aminoethylphosphonic acid | 0.1 g |
| Methanol | 50 g |
| Deionized water | 50 g |

[Photosensitive Layer]

Then, the following photo sensitive layer-coating solution (1) was prepared, and coated on the undercoated aluminum plate using a wire bar, followed by drying at 115° C. for 45 seconds using a warm air dryer to form a photosensitive layer. The dry coated amount was in the range of from 1.2 to 1.3 g/$m^2$. [Photosensitive layer-coating solution (1)]

| | |
|---|---|
| Infrared ray absorbing agent (IR-1) | 0.20 g |
| Onium salt (OI-1) | 0.30 g |
| Dipentaerythritol hexaacrylate | 1.00 g |
| Copolymer of allyl methacrylate and methacrylic acid (80:20 in molar ratio) | 1.00 g |
| 3-Diethylamino-6-methyl-7-anilinofluoran | 0.15 g |
| Silicon-containing surfactant (trade name: TEGO GLIDE 100; product of Tego Chimie Service GmbH) | 0.03 g |
| Methyl ethyl ketone | 9.0 g |
| Methanol | 10.0 g |
| 1-Methoxy-2-propanol | 8.0 g |

Additionally, structures of the infrared ray-absorbing agent (IR-1) and the onium salt (OI-1) used in the above photosensitive layer-coating solution are as shown below.

IR-1

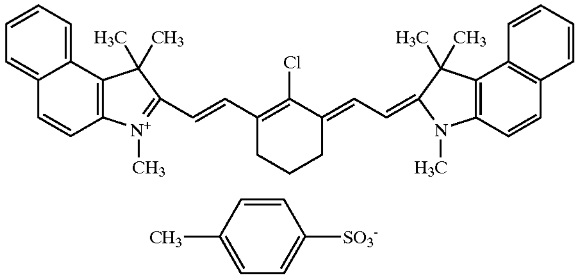

OI-1

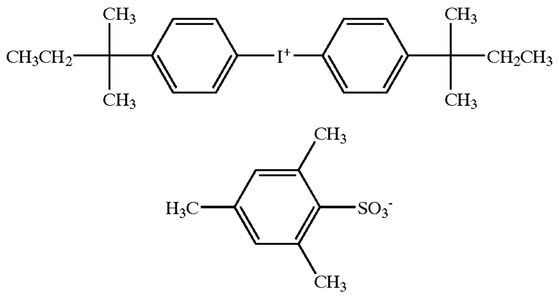

The resultant lithographic printing plate precursor was exposed using Trendsetter 3244VFS (made by Creo Co.) equipped with a water-cooled, 40-W infrared semiconductor laser in a plate surface energy of 200 mJ/cm$^2$.

The thus exposed lithographic printing plate precursor underwent color-formation of the photosensitive layer in the laser-exposed areas, and difference in density between non-exposed areas and exposed areas was measured by means of a Gretag Macbeth reflective densitometer (R19C) to be 0.15, thus good print-out properties being demonstrated.

Then, the following composition [G] was charged as a developing solution in an automatic processor, STABLON 900NP, made by Fuji Photo Film Co., Ltd. and, further, an aqueous solution of FP-2W (1:1) was charged therein as a gumming solution. The exposed lithographic printing plate precursor was developed and gummed in the automatic processor to obtain a lithographic printing plate. The thus obtained printing plate also showed good suitability for plate inspection. [Developing solution [G]]

| | |
|---|---|
| Potassium sulfite | 0.05% by weight |
| Potassium hydroxide | 0.1% by weight |
| Potassium carbonate | 0.2% by weight |
| Ethylene glycol mononaphthyl ether | 4.8% by weight |
| 4Na salt of EDTA | 0.13% by weight |
| Silicone-based surfactant | 0.02% by weight |
| Water | 94.7% by weight |

Then, the thus obtained lithographic printing plate was mounted on a printer LITHRON (made by Komori Corporation) to conduct printing. Thus, good printed products were obtained.

Example 2

A lithographic printing plate precursor [P-2] was obtained in the same manner as in Example 1 except for adding 0.15 g of 3,3-bis(p-dimethylaminophenyl)-6-dimethylamino-phthalide in place of 3-diethylamino-6-methyl-7-anilinofluoran. Further, laser exposure was conducted in the same manner as in Example 1. Difference in density between non-exposed areas and exposed areas was measured to be 0.12, which demonstrates good print-out properties.

Further, development and evaluation of printing were conducted in the same manner as in Example 1. Thus, there were demonstrated good suitability for plate inspection after development as in Example 1, and good printed matters were obtained with no troubles.

Comparative Example 1

A lithographic printing plate precursor was prepared in absolutely the same manner as in Example 1, except for omitting 3-diethylamino-6-methyl-7-anilinofluoran in the photosensitive layer-coating solution used in Example 1. Laser exposure was conducted in the same manner as in Example 1, but no images were formed in the laser-exposed plate.

Subsequently, evaluation on printing was conducted. Although printed products were obtained with no troubles, the developed plate showed insufficient suitability for plate inspection.

It was confirmed from the above results that the lithographic printing plate precursor containing the organic dye or the precursor thereof in accordance with the present invention shows good print-out properties.

The present invention provides a negative-working lithographic printing plate precursor which enables to conduct direct plat-making by recording digital data from a computer or the like using a solid state laser or a semiconductor laser capable of irradiating infrared rays and which shows good print-out properties.

The entitle disclosure of each and every foreign patent application from which the benefit of foreign priority has been claimed in the present application is incorporated herein by reference, as if fully set forth herein.

While the invention has been described in detail and with reference to specific examples thereof, it will be apparent to one skilled in the art that various changes and modifications can be made therein without departing from the spirit and scope thereof.

What is claimed is:

1. A lithographic printing plate precursor comprising a support having provided thereon a photosensitive layer containing at least (A) an infrared ray absorbing agent, (B) an onium salt, (C) a radically polymerizable compound, (D) a binder polymer and (E) an organic dye or the precursor thereof capable of undergoing change in color tone upon exposure; wherein the organic dye or the precursor thereof has an acid-dissociatable lactone skeleton.

2. The lithographic printing plate precursor as claimed in claim 1, wherein the precursor thereof undergoes change in color tone due to an active seed generated by actinic rays.

3. The lithographic printing plate precursor as claimed in claim 1, wherein the organic dye or the precursor thereof is a leuco dye.

4. The lithographic printing plate precursor as claimed in claim 1, wherein the organic dye or the precursor thereof is contained in an amount of from 1 to 20% by weight.

5. The lithographic printing plate precursor as claimed in claim 1, wherein the infrared ray absorbing agent is a dye or a pigment having an absorption maximum in the range of from 760 to 1200 nm in wavelength.

6. The lithographic printing plate precursor as claimed in claim 1, wherein the organic dye or the precursor thereof having an acid-dissociatable lactone skeleton is selected from the group consisting of phthalides and flourans.

* * * * *